(12) United States Patent
Song et al.

(10) Patent No.: US 7,694,211 B2
(45) Date of Patent: Apr. 6, 2010

(54) METHOD AND APPARATUS FOR ERROR COMPENSATION

(75) Inventors: Hongwei Song, Longmont, CO (US); Lingyan Sun, Longmont, CO (US)

(73) Assignee: Agere Systems, Inc., Allentown, PA (US)

( * ) Notice: Subject to any disclaimer, the term of this patent is extended or adjusted under 35 U.S.C. 154(b) by 898 days.

(21) Appl. No.: 11/465,877

(22) Filed: Aug. 21, 2006

(65) Prior Publication Data

US 2008/0065962 A1 Mar. 13, 2008

(51) Int. Cl.
*H03M 13/03* (2006.01)
*H04L 27/06* (2006.01)

(52) U.S. Cl. ...................................... 714/786; 375/341

(58) Field of Classification Search .................. 714/786, 714/752, 795, 798, 799, 780; 375/262, 341
See application file for complete search history.

(56) References Cited

U.S. PATENT DOCUMENTS 5,666,170 A * 9/1997 Stewart ....................... 348/726
5,671,253 A * 9/1997 Stewart ....................... 375/316
7,415,651 B2 * 8/2008 Argon ......................... 714/755
7,443,936 B1 * 10/2008 Sallaway et al. ............. 375/350
2005/0273688 A1 * 12/2005 Argon ......................... 714/755
2006/0140311 A1 * 6/2006 Ashley et al. ................ 375/341
2006/0168493 A1 * 7/2006 Song ........................... 714/752

* cited by examiner

*Primary Examiner*—Phung M Chung

(57) ABSTRACT

Various approaches to recover data are described. An one example, an encoded data stream is processed in a first channel decoder producing a channel decoder output. The channel decoder output and the encoded data stream are processed in an error compensation unit to compensate the channel decoder output for low frequency noise and produce an error compensated data stream. The error compensated data stream is processed in a second channel decoder to produce a recovered data stream, wherein the recovered data stream has a reduction in the number of errors as compared to the encoded data stream. Systems to iteratively recover data from an encoded data stream are also described.

17 Claims, 4 Drawing Sheets

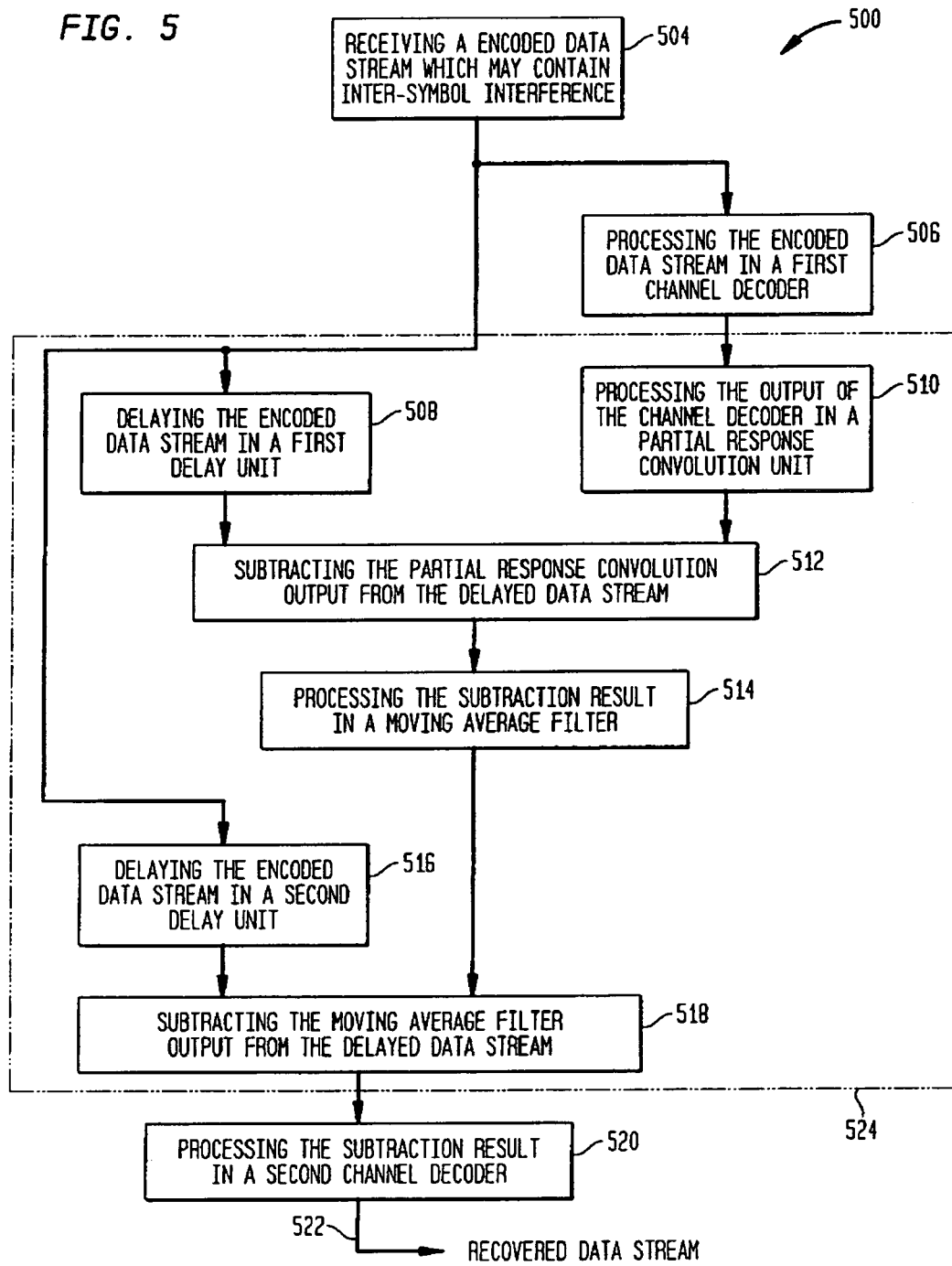

METHOD AND APPARATUS FOR ERROR COMPENSATION

CROSS REFERENCE TO RELATED APPLICATION

This application is related to the commonly owned copending application of H. Song et al., U.S. application Ser. No. 11/341,963, entitled "Systems and Methods For Error Reduction Associated With Information Transfer", filed Jan. 26, 2006, the specification of which is incorporated herein by reference.

FIELD OF THE INVENTION

The present invention relates generally to improved methods and apparatus for error compensation, and more particularly, to advantageous techniques for reconstructing equalized samples.

BACKGROUND OF INVENTION

Digital communication systems, such as wireless communication systems, and digital storage systems, such as hard disk drive systems, transfer information in the presence of noise. Improving the accuracy of information transfer in such systems may entail the use of complex error recovery techniques, such as the use of elaborate error correction codes.

Digital magnetic recording stores digital data by modulating a magnetic flux pattern in a magnetic medium. During the storing process, all electric current in a write head is modulated based on the digital data to be written. The head is positioned over magnetic material in the shape of a circular disk which rotates rapidly. The electric current in the write head, in turn, modulates the magnetic flux pattern in the medium. The medium used is such that the flux pattern is retained in the medium after the electric current is turned off in the write head, thus providing data storage.

Data is usually written in the medium in concentric circles called tracks, which are further divided into user or read data sectors and servo sectors embedded between the read data sectors. The servo sectors contain data and supporting bit patterns required for control and synchronization. The control and synchronization information is used to position the magnetic recording head, so that the information stored in the read data sectors is retrieved properly. Being able to accurately read data is important to the operation and recovery of inflation in digital storage systems. To improve the accuracy of reading data, data is written to a medium using an error correcting technique, such as, an interleaved parity technique, which interleaves parity bits throughout the data to be stored.

During a process to read the stored data, a read head, for example, is positioned over the medium following the tracks. The magnetic flux patterns stored in the medium induce a varying current in the read head. This varying current is then processed to recover the written data, including the interleaved parity bits. Both the actions of writing data and reading data are susceptible to noise from various sources, including near-DC noise, which is noise of a relatively low frequency. To accurately retrieve the data, the process of interpreting the signals from the read head can use, for example, filtering, amplification, timing acquisition, and error correction techniques.

While perpendicularly recorded magnetic media allows for greater recording densities and improved data transfer performance, the challenge to accurately store and read data becomes more difficult. Even though perpendicularly recorded media poses a different set of problems than longitudinally recorded media, both storage technologies require efficient error correction techniques to minimize the effects of noise and detrimental media and read and write channel characteristics.

SUMMARY OF INVENTION

Among its several aspects, the present invention recognizes that there is a need for accurate and efficient techniques for recovering data during an information transfer process.

To address such needs, an embodiment of the present invention includes a method to recover data. An encoded data stream is processed in a first channel decoder producing a channel decoder output. The channel decoder output and the encoded data stream is processed in an error compensation unit to compensate the channel decoder output for low frequency noise and produce an error compensated data stream. The error compensated data stream is processed in a second channel decoder to produce a recovered data stream, wherein the recovered data stream has a reduction in the number of errors as compared to the encoded data stream.

Another embodiment of the present invention addresses an apparatus to recover data. A first channel decoder is used to process an encoded data stream and produce a channel decoder output. An error compensation unit processes the channel decoder output and the encoded data stream to compensate the channel decoder output for low frequency noise and produce an error compensated data stream. A second channel decoder processes the error compensated data stream to produce a recovered data stream, wherein the recovered data stream has a reduction in the number of errors as compared to the encoded data stream.

A further embodiment of the present invention addresses an apparatus to iteratively recover data. A first error detection and compensation stage is used to process an encoded data stream and produce a soft output improved reliability estimate and a first delayed error compensated data stream. A second error detection and compensation stage processes the soft output improved reliability estimate and the first delayed error compensated data stream to produce a second soft output improved reliability estimate and a second delayed error compensated data stream. A channel detector processes the second soft output improved reliability estimate and the second delayed error compensated data stream to produce a recovered data stream, wherein the recovered data stream has been compensated for low frequency noise and has a reduction in the number of errors as compared with the encoded data stream.

A more complete understanding of the present invention, as well as other features and advantages of the invention, will be apparent from the following detailed description and the accompanying drawings.

BRIEF DESCRIPTION OF DRAWINGS

FIG. 5 illustrates a method for providing error compensation in detecting encoded data in accordance with one embodiment of the present invention.

DETAILED DESCRIPTION

Figure 1:
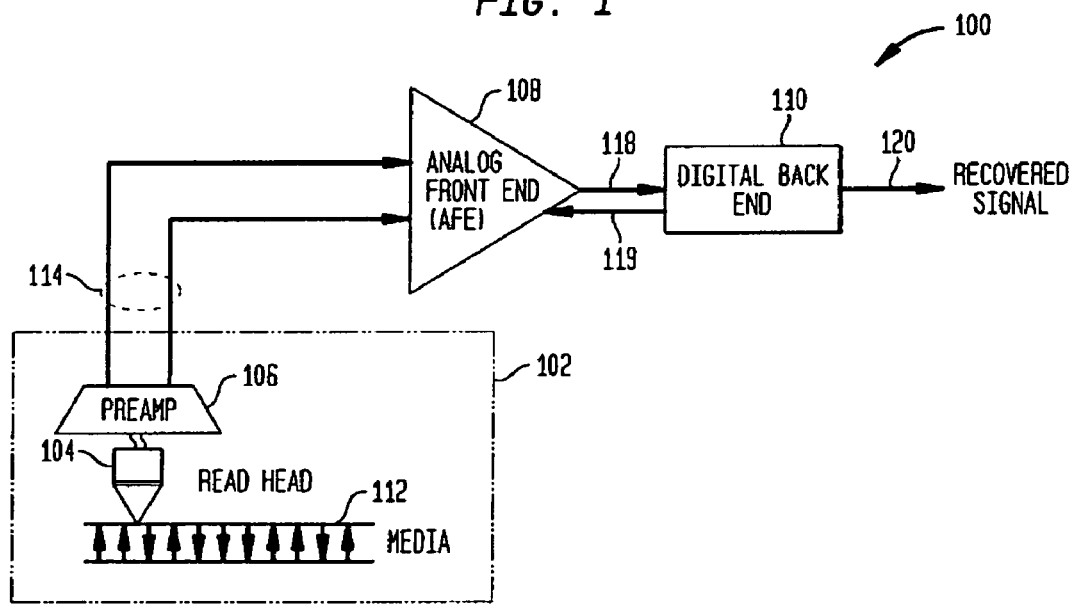
FIG. 1 illustrates an exemplary system having a read head subsystem for a perpendicular recording disk drive system, an analog front end, and a digital back end (DBE) in accordance with one embodiment of the present invention.

The present invention will now be described more fully with reference to the accompanying drawings, in which several embodiments and various aspects of the invention are shown. This invention may, however, be embodied in various forms and should not be construed as being limited to the embodiments set forth herein. Rather, these embodiments are exemplary, and are provided so that this disclosure will be thorough and complete, and will fully convey the scope of the invention to those skilled in the art.

Some embodiments of the present invention provide methods for error reduction in an electronic system. As used herein, the phrase "error reduction" is used in its broadest sense to mean any reduction in differences between an original data set and a recovered data set. These methods may include processing encoded data received from a data channel using a channel decoder to handle inter-symbol interference in the channel. The channel decoder may provide both a hard output and a soft output. As used herein, the phrases "hard output" and "soft output" are given their general meaning in the art, where a hard output is a predicted bit value, and a soft output is an associated reliability value of the predicted bit. Further, as used herein, the phrase "encoded data set" is used in its broadest sense to mean any data set that has been modified such that the data set must be decoded to recover the original data set. Thus, as just one example, an encoded data set may be modified to include error correction data in addition to the original data set. As used herein, the phrase "error correction data" is used in its broadest sense to mean any information whether it be a single bit or a collection of bits that may be used to detect and/or correct an error. Thus, error correction data may be, but is not limited to, a parity bit, a group of parity bits, and/or a checksum.

The aforementioned methods further include processing the hard output and the soft output from the channel decoder using an interleaved multiple single-parity row decoder that in turn can provide a hard output and soft output. In addition, the encoded data set is provided to a delay element to form a time shifted encoded data set. As used herein, the phrase "delay element" is used in its broadest sense to mean any circuit, device or system capable of time shifting an electrical and/or data signal. Thus, for example, a delay element may be, but is not limited to, a clocked register or flip-flop, or some combinatorial logic with a predictable propagation delay.

In some cases of the aforementioned embodiments, processing can be performed across multiple iterative stages where an iterative stage includes at least a channel decoder and an interleaved multiple single-parity row decoder. As used herein, the phrase "iterative stage" is used in its broadest sense to mean any collection of elements or operations that can be substantially replicated.

Various embodiments of the present invention provide systems and methods that combine channel decoders and iterative decoding techniques to reliably recover inflation from an electronic medium. In some cases, the information may be recovered from a storage medium such as a hard disk drive, a tape recording system, an optical disk drive, or the like. Using embodiments of the present invention, accessed information exhibiting a low signal to noise ratio may be recovered with a high correcting effect, which decreases random and/or burst errors and the effects of low frequency noise exhibited in an original information signal. The correcting effect offered by various embodiments of the present invention may be used, for example, to facilitate accessing digital data stored at very high densities where signal to noise ratio can be an inhibiting design consideration.

FIG. 1 illustrates an exemplary system 100 having a read head subsystem 102 for a perpendicular recording disk drive system, an analog front end 108, and a digital back end (DBE) 110 in accordance with the present invention. The read head subsystem 102 utilizes a magnetoresistive (MR) read head 104 and pre-amp 106 to obtain data from media 112. The system 100 further utilizes an analog front-end (AFE) 108 and a digital back end 110. It will be appreciated that other systems with an analog front-end may benefit from the teachings of the present invention. For example, horizontal recording disk drive systems and the like may also benefit from aspects of the present invention.

The requirements of the system 100 designed for use in a perpendicular recording disk drive system can be significantly more stringent than those for a system for use in conjunction with a horizontal recording technique, which is the primary recording technology used in the most common present day disk drives. The perpendicular recording technology stores data in closely packed vertical magnetized units in sectors on media 112, such as a read/write disk. Data is typically stored using an error correction encoding technique. The MR read head 104, designed for perpendicular recorded media 112, senses the vertical magnetized units to produce a signal that is closely coupled to a read head circuit containing a preamplifier stage, such as preamp 106, which provides a first stage of amplification of the MR read head signal.

Preamp 106 typically is located close to the MR read head 104 and may amplify and drive a differential signal 114 to the AFE 108, which might be suitably located on a disk drive card, for example. In the illustrated embodiment, the differential signal 114 contains encoded information recorded on the media 112 and noise, such as low frequency noise and noise from other sources of noise. The output of the AFE 108 is connected to the digital back end 110. The recovery of the information recorded on the media is accomplished by the AFE 108 and the digital back end (DBE) 110.

In one embodiment, the AFE 108 generates an encoded data stream 118 from the differential signal 114 and receives feedback and control signals 119 from the DBE 110. The DBE 110 generates a recovered signal 120 which represents the recovered data. The DBE 110 may use a channel decoder, such as, a probabilistic decoder that typically relies on a Viterbi algorithm, for example.

Figure 2:
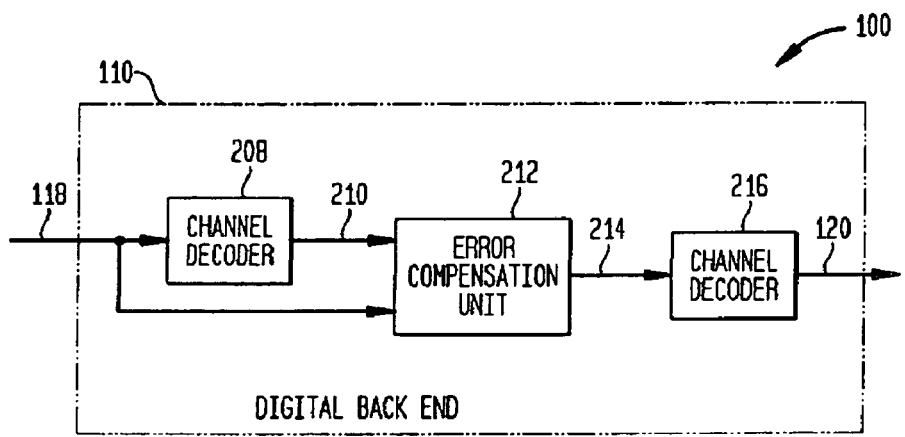
FIG. 2 illustrates further details of the DBE having an error compensation unit in accordance with one embodiment of the present invention.

FIG. 2 illustrates further details of the digital back end (DBE) 110 including an error compensation unit 212 in accordance with the present invention. In the illustrated embodiment, the DBE 110 comprises a first channel decoder 208, an error compensation unit 212, and a second channel decoder 216. The DBE 110 receives the encoded data stream 118 which may be of different resolutions depending upon the requirements of the product. For example, a six-bit resolution may be used as a representative equalized sample for data in the encoded data stream 118. The DBE 110 generates the recovered signal 120. It is noted that the channel decoders 208 and 216 may be implemented as Viterbi decoders using similar or substantially the same trellis diagram in both channel decoders.

In accordance with the illustrated embodiment, the first channel decoder 208 generates bit decisions $x_k$ 210 based on the encoded data stream 118. The bit decisions $x_k$ 210 and the encoded data stream 118 are provided to the error compensation unit 212, which estimates errors and reconstructs error compensated equalized samples as an error compensated data stream 214. The error compensation unit 212 averages out the timing, gain, and DC offset errors that may be present in the encoded data stream 118. The error compensated data stream 214 is received in the second channel decoder 216, which generates the recovered signal 120. The second channel decoder 216, which may be, for example, a hard output Viterbi algorithm channel decoder, that is used to further minimize transmission errors, can, for example, compensate for low frequency noise, and recovers the original information with high reliability.

Figure 3:
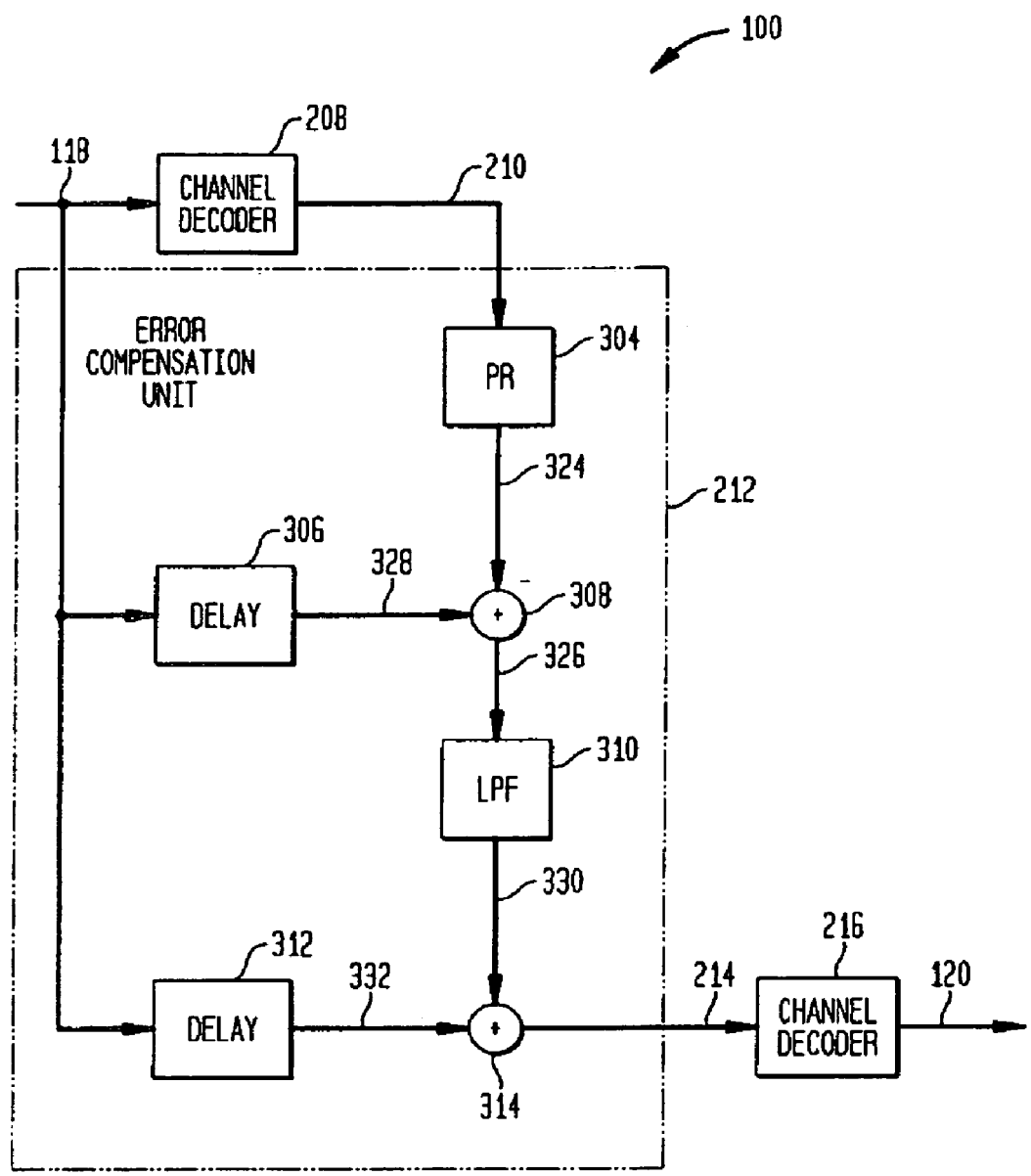
FIG. 3 illustrates further details of the error compensation unit of the DBE in accordance with one embodiment of the present invention.

FIG. 3 illustrates further details of the error compensation unit 212 of the DBE 110 in accordance with one embodiment of the present invention. In the illustrated embodiment, the error compensation unit 212 contains a partial response convolution unit 304, a first delay element 306, a first subtract unit 308, a low pass filter 310, a second delay element 312, and a second subtract unit 314. The digital back end 110 provides a novel method to reconstruct equalized samples in the second channel decoder 216 using decisions made in the first channel decoder 208 and compensated by the error compensation unit 212. The digital back end (DBE) 110 containing the error compensation unit 212 can reliably reconstitute inflation recorded on a medium even when the signal to noise ratio (SNR) is low.

In the illustrated embodiment, the first channel decoder 208 receives the encoded data stream 118, which may contain inter-symbol interference, and delivers bit decisions $x_k$ 210 based on the encoded data stream 118. For example, low frequency noise may have corrupted a bit or bits in the encoded data stream. The bit decisions $x_k$ 210 are convolved in the partial response convolution unit 304 with a partial response target f used in the read channel to obtain equalized samples $r_k$ 324, $r_k$=sum $\{x_{k-i} f_i\}$. The partial response target f may be stored in a memory, such as a read-only memory, within the partial response convolution unit 304 or may be loaded by a programmable access path to the unit. Subtraction results 326 are obtained from the first subtraction unit 308 by subtracting the equalized samples $r_k$ 324 from delayed encoded data stream 328. Delay element 306 provides a delay equal to the delay of the first channel decoder 208 plus the delay of generating $r_k$ 324. The delay of the first channel decoder 208 plus the delay of the partial response convolution unit 304 may be about 30-40 T, for example, where T is based on a clock rate, such as the clock period, used in the error compensation unit 212. For example, if the clock rate is 1 GHz, then 1 T equals 1 nanosecond. Delay elements allow corresponding data samples to be processed at substantially the same time, which may be within a processing window of time, for example.

Subtraction results 326 are then filtered by a low pass filter (LPF) 310. The LPF 310 may be implemented as a simple moving average filter of order 64 to 256 with step 64, for example, and is used to smooth errors received on the subtraction results 326. In one embodiment, the LPF 310 may be adapted to filter near-DC noise that is of a relatively low frequency, for example, adapting to a cutoff frequency of approximately 5% of the Nyquist frequency. The frequency response, cutoff frequency, order and step size are flexible and may be adjusted as required for an application. Average errors 330 are then subtracted from a second delayed encoded data stream 332 to generate the error compensated data stream 214. Delay element 312 produces a delay equal to the delay of delay element 306 plus the delay of the LPF 310, whose delay may be about 60-150 T, for example. The error compensated data stream 214 is received in the second channel decoder 216, which generates the recovered signal 120. Channel decoders 208 and 216 may use trellis diagrams that are similar or substantially the same and generally determined by the partial response target f and data-dependent noise predictive filters which may be used.

Figure 4:
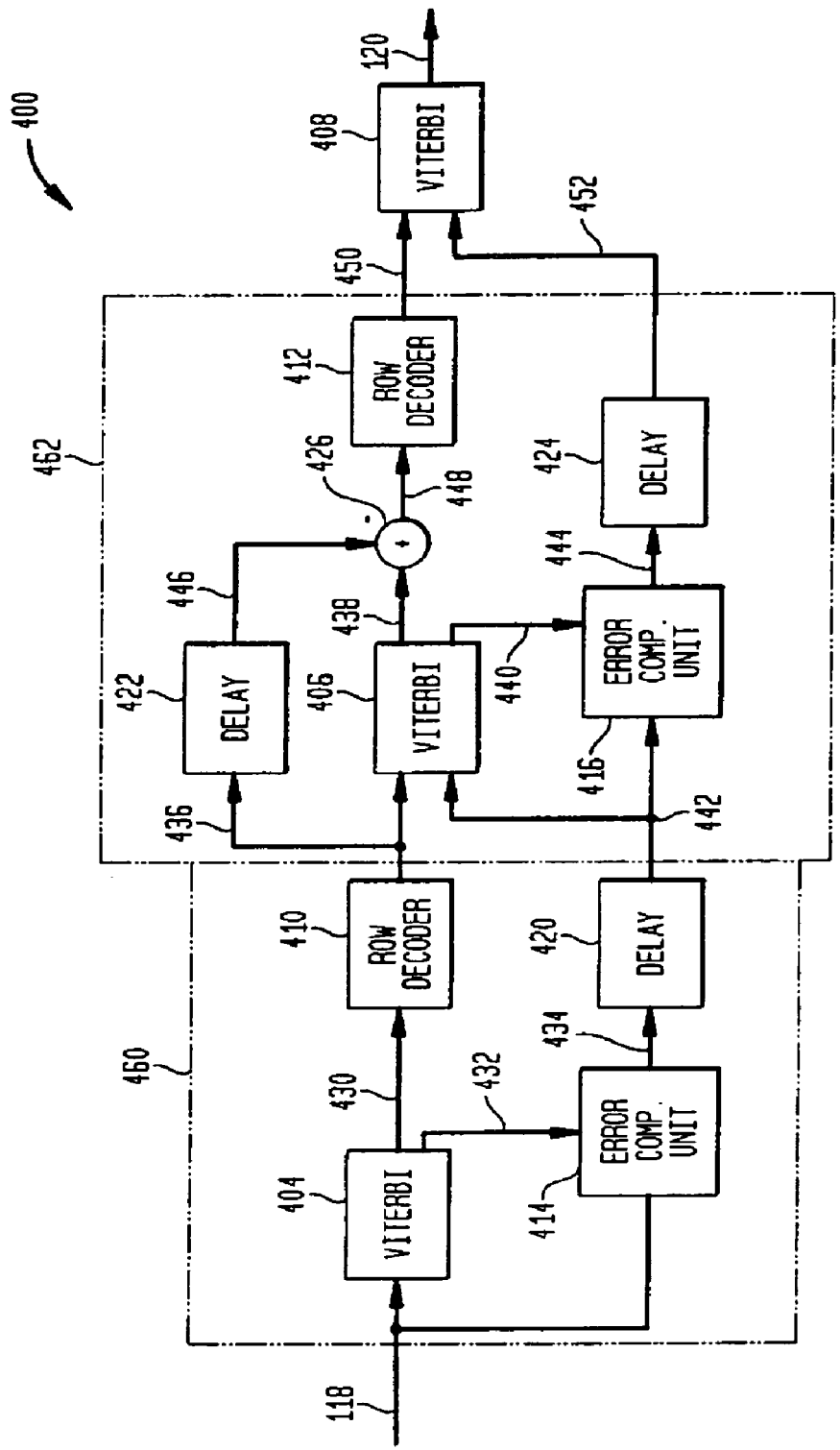
FIG. 4 illustrates an iterative error compensated detector in accordance with one embodiment of the present invention.

FIG. 4 illustrates an iterative error compensation detector 400 in accordance with one embodiment of the present invention. In this embodiment, the iterative error compensation detector 400 uses soft output Viterbi algorithm (SOVA) Viterbi decoders 404 and 406, a hard or soft output Viterbit decoder 408, row decoders 410 and 412, error compensation units 414 and 416, delay elements 420, 422, and 424, and subtractor 426. As one skilled in the art will appreciate, SOVA decoder uses a Viterbi algorithm to generate a soft output that provides confidence information or reliability estimates regarding path decisions made by the Viterbi algorithm. More specifically, SOVA decoder provides a hard output, which corresponds to the path decisions generated by a Viterbi algorithm, and a soft output which corresponds to reliability estimates of the hard output. For example, a hard output may be a single binary bit as a 0 or a 1 and a soft output may be an eight bit value representing a reliability estimate of the hard output binary value. For example, a hard output may be a "1" and the reliability estimate of the hard output being a "1" may vary from fifty to one hundred percent.

In one embodiment, row decoders 410 and 412 operate, for example, using interleaved parity check encoding technique used to store data in the storage system. For example, an interleaved odd or even parity row encoding technique may be used to encode the data in a defined row organization. A row decoder then may receive data in an interleaved parity odd or even parity order as the soft output of a Viterbi decoder. In one embodiment, the soft output of the SOVA may be represented as a log-likelihood ratio (LLR). The row decoders 410 and 412 then generate a soft output improved reliability value. For example, with a soft output reliability estimate LLR(80%) at a row decoder input, the output of the row decoder may generate an improved LLR(90%) at its output. In one aspect of the present invention, a comparison of the row decoder output with the corresponding row decoder input by use of a subtractor, such as subtractor 426, generates a refined reliability value (e.g., LLR(90%)−LLR(80%) in the above example). It is noted that the subtractor works in the domain of the LLRs. For the above example:

$$LLR(90\%) - LLR(80\%) = \log(90/10) - \log(80/20) = \log(2.25)$$

Still referring to FIG. 4, the operation of iterative error compensation detector 400 will be described. More specifically, the iterative error compensation detector 400 operates by receiving the encoded data stream 118 in SOVA Viterbi decoder 404. The SOVA Viterbi decoder 404 generates a soft output 430 and a hard output 432. The error compensation unit 414 operates in similar fashion to error compensation unit 212 of FIG. 3, and, in this embodiment, receives the encoded data stream 118 and hard output 432. The error compensation unit 414 produces an error compensation data stream 434, which is delayed through the delay element 420 to compensate for the delay of the soft output 430 through row decoder 410. The delay element 420 produces a delayed error compensated data stream 442, and the row decoder 410 provides soft output improved reliability estimate values 436 (as discussed above) to a SOVA Viterbi decoder 406 and delay unit 422.

The SOVA Viterbi decoder 406 generates a soft output 438 and hard output 440 based on the improved reliability estimate values 436 and the delayed error compensated data stream 442. The error compensation unit 416 operates in a similar fashion to error compensation unit 414 and 212 of FIG. 3. The error compensation unit 416 receives the delayed error compensated data stream 442 and hard output 440 to generate a second error compensated data stream 444. The soft output 438 is compared to corresponding improved reliability estimate values 436 obtained at the output 446. The output 446 and the soft output 438 are subtracted in subtractor 426 to generate refined reliability estimate values 448.

The refined reliability estimate values 448 are provided to the row decoder 412, which, as discussed above, generates soft output improved reliability estimate values 450. The second error compensated data stream 444 is delayed by delay element 424 to produce a delayed error compensated data stream 452. The delayed error compensated data stream 452 and the improved reliability estimate values 450 are received by the hard or soft output Viterbi decoder 408 which generates the recovered signal 120. In one embodiment, the iterative decoding provided by the iterative error compensated detector 400 improves read channel performance by about 1.3-2x, which is about a 0.1-0.4 dB signal to noise ration (SNR) gain as measured by examination of the recovered signal 120.

It is noted that table look-ups may be used to do data regeneration in partial response convolution units that are located in the error compensated units 414 and 416. Accumulators may also be used in the low pass filters (LPFs) to implement a moving average filter in the error compensated units 414 and 416. Buffers are used as appropriate, for example, at the input of the LPFs and at other locations where data might require temporary storage.

The iterative error compensated detector 400 is illustrated using two error detection and compensation stages 460 and 462 that are both built upon the single stage approach shown in FIG. 3. The iterative stages may lead to improved recovery of information as compared to a single stage detector. It is appreciated that additional error detection stages may be used depending upon the requirements of a design, though the number of stages that provide useful error reduction may be bounded by a particular application.

FIG. 5 illustrates one embodiment of a method 500 for providing error compensation in detecting encoded data in accordance with the present invention. In step 504, an encoded data stream, which may have inter-symbol interference, is received. Such receiving is comparable to the digital back end (DBE) 110 of FIG. 1 receiving the encoded data stream 118. In step 506, the encoded data stream is processed in a first channel decoder, such as channel decoder 208. In step 508, the encoded data stream is delayed in a first delay element, such as delay element 306, producing a first delayed data stream. In step 510, the output of the channel decoder is processed in a partial response convolution unit, such as partial response convolution unit 304. In step 512, the partial response convolution output is subtracted from the first delayed data stream, such as the subtraction accomplished by subtractor 308. In step 514, the subtraction result is processed in a moving average filter, such as the low pass filter 310. In step 516, the encoded data stream is delayed in a second delay element, such as delay element 312, producing a second delayed data stream. In step 518, the moving average filter output is subtracted from the second delayed data stream, such as the subtraction accomplished by subtractor 314. In step 520, the subtraction result is processed in a second channel decoder, such as channel decoder 216, generating a recovered data stream 522, such as, the recovered signal 120 that has been compensated for low frequency noise and has a reduction in the number of errors as compared to the encoded data stream. Error compensation steps 524 may suitably be obtained by the error compensation unit 212.

While the present invention has been disclosed in a presently preferred context, it will be recognized that the present teachings may be adapted to a variety of contexts consistent with this disclosure and the claims that follow. For example, the present invention is disclosed mainly in the context of error recovery in a digital storage system. It will appreciated that it may also be employed with a communication system, such as a wireless communication system for the reception of transmitted voice or image data, for example. It will also be appreciated that variations in the particular hardware and software employed are feasible, and to be expected as both evolve with time. For example, it is possible that digital signal processors may be used to implement the function of error compensated detectors. Also, the present invention is disclosed mainly using interleaved multiple single-parity coding techniques as an example. It will be appreciated that the error compensation technique may generally use any channel coding technique. Other such modifications and adaptations to suit a particular design application will be apparent to those of ordinary skill in the art.

We claim:

1. A method to recover data comprising: processing an encoded data stream in a first channel decoder producing a channel decoder output;
   processing the channel decoder output and the encoded data stream in all error compensation unit to compensate the channel decoder output for low frequency noise and produce an error compensated data stream;
   processing the error compensated data stream in a second channel decoder to produce a recovered data stream, wherein the recovered data stream has a reduction in the number of errors as compared to the encoded data stream;
   processing the channel decoder output in a partial response (PR) convolution unit to produce a PR convolution output;
   subtracting the PR convolution output from a first delayed encoded data stream to produce a first subtraction result;
   filtering the first subtraction result in a data stream filter to produce a filter output; and
   subtracting the filter output from a second delayed encoded data stream to produce the error compensated data stream.

2. The method of claim 1 wherein the encoded data stream is delayed by a first delay period that is the sum of the delay through the first channel decoder and the delay through the PR convolution unit to produce the first delayed encoded data stream.

3. The method of claim 1 wherein the encoded data stream is delayed by a second delay period that is the sum of the first delay period and the delay through the data stream filter to produce the second delayed encoded data stream.

4. The method of claim 1 further comprising: receiving an analog encoded data stream in an analog front end system to generate the encoded data stream as a digital representation of information contained in the analog encoded data stream.

5. The method of claim 4 further comprising reading the analog encoded data stream from a magnetic medium.

6. The method of claim 1 wherein the data stream filter is a moving average filter.

7. An apparatus to recover data comprising:
   a first channel decoder to process an encoded data stream and produce a channel decoder output;

an error compensation unit to process the channel decoder output and the encoded data stream to compensate the channel decoder output for low frequency noise and produce an error compensated data stream;

a second channel decoder to process the error compensated data stream to produce a recovered data stream, wherein the recovered data stream has a reduction in the number of errors as compared to the encoded data stream;

a partial response (PR) convolution unit to process the channel decoder output and produce a PR convolution output;

a first subtractor to subtract the PR convolution output from a first delayed encoded data stream to produce a first subtraction result; a data stream filter to filter the first subtraction result to produce a filter output; and a second subtractor to subtract the filter output from a second delayed encoded data stream to produce the error compensated data stream.

8. The apparatus of claim 7 further comprising: a first delay unit to delay the encoded data stream by a first delay period that is the sum of the delay through the first channel decoder and the delay through the PR convolution unit to produce the first delayed encoded data stream.

9. The apparatus of claim 7 further comprising: a second delay unit to delay the encoded data stream by a second delay period that is the sum of the first delay period and the delay through the data stream filter to produce the second delayed encoded data stream.

10. The apparatus of claim 7 further comprising: an analog front end system to receive an analog encoded data stream and generate the encoded data stream as a digital representation of information contained in the analog encoded data stream including inter-symbol interference.

11. The apparatus of claim 10 further comprising: a read head subsystem for reading data stored in a magnetic medium to produce the analog encoded data stream.

12. The apparatus of claim 7 wherein the data stream filter is a low pass filter which is adapted to a cutoff frequency of approximately 5% of the Nyquist frequency.

13. A machine-readable storage medium, having encoded thereon program code, wherein, when the program code is executed by a machine, the machine implements a method for recovering data, comprising the steps of:

processing an encoded data stream in a first channel decoder producing a channel decoder output;

processing the channel decoder output and the encoded data stream in an error compensation unit to compensate the channel decoder output for low frequency noise and produce an error compensated data stream;

processing the error compensated data stream in a second channel decoder to produce a recovered data stream, wherein the recovered data stream has a reduction in the number of errors as compared to the encoded data stream;

processing the channel decoder output in a partial response (PR) convolution unit to produce a PR convolution output;

subtracting the PR convolution output from a first delayed encoded data stream to produce a first subtraction result;

filtering the first subtraction result in a data stream filter to produce a filter output; and subtracting the filter output from a second delayed encoded data stream to produce the error compensated data stream.

14. The machine-readable storage medium of claim 13 wherein the encoded data stream is delayed by a first delay period that is the sum of the delay through the first channel decoder and the delay through the PR convolution unit to produce the first delayed encoded data stream.

15. The machine-readable storage medium of claim 13 wherein the encoded data stream is delayed by a second delay period that is the sum of the first delay period and the delay through the data stream filter to produce the second delayed encoded data stream.

16. The machine-readable storage medium of claim 13 comprising: receiving an analog encoded data stream in an analog front end system to generate the encoded data stream as a digital representation of information contained in the analog encoded data stream.

17. The machine-readable storage medium of claim 16 comprising reading the analog encoded data stream from reading data stored in a magnetic medium and wherein the data stream filter is a moving average filter.

* * * * *